United States Patent [19]
Vercellotti et al.

[11] Patent Number: 5,774,000
[45] Date of Patent: Jun. 30, 1998

[54] DC SEMICONDUCTOR SWITCH

[75] Inventors: Leonard C. Vercellotti, Pawleys Island, S.C.; Stephen A. Lane, Cockeysville, Md.

[73] Assignee: Northrop Grumman Corporation, Los Angeles, Calif.

[21] Appl. No.: 745,981

[22] Filed: Nov. 8, 1996

[51] Int. Cl.$^6$ ...................................................... H03B 1/00
[52] U.S. Cl. .......................... 327/110; 327/313; 327/403; 327/502
[58] Field of Search .................................. 326/85, 87, 91; 327/110, 309, 313, 314, 321, 326, 327, 328, 403, 404, 502, 584; 388/903

[56] References Cited

U.S. PATENT DOCUMENTS 4,890,020  12/1989  Bird ......................................... 327/502

*Primary Examiner*—Timothy P. Callahan
*Assistant Examiner*—Jeffrey Zweizig
*Attorney, Agent, or Firm*—Walter G. Sutcliff

[57] ABSTRACT

A semiconductor switch including a plurality of die assembled hybrid circuit packages. Each package includes a relatively large number of parallely connected semiconductor switch devices, more particularly metal oxide semiconductor field effect transistors (MOSFETs). An active snubber circuit is connected to the MOSFETs in order to remove the requirement for current sharing during circuit interruption where the MOSFETs turn-off. Each MOSFET package furthermore includes metallic arc barriers between MOSFETs to prevent an arc from propagating from one failed MOSFET to neighboring MOSFETs. Also all of the MOSFETs are turned on momentarily to extinguish arcs whenever the semiconductor switch is in an open or non-conducting condition and a current flow is detected. Clamping of the gate electrode drive bus of the MOSFETs is additionally provided to ensure fusing of gate bonding wires coupling the gate electrodes of the respective MOSFETs to the gate drive bus.

20 Claims, 9 Drawing Sheets

5,774,000

DC SEMICONDUCTOR SWITCH

BACKGROUND OF THE INVENTION

This invention relates generally to semiconductor switch devices and more particularly to a semiconductor switch utilizing parallel metal-oxide-semiconductor field-effect transistors which are die assembled into hybrid circuit packages.

DESCRIPTION OF THE PRIOR ART

The replacement of DC electromechanical circuit breakers by semiconductor switches is generally known and has been proposed by those skilled in the art of electronic circuit design as a means to reduce maintenance and enhance reliability. This is also known to involve retrofitting existing equipment; however, it involves constraints with respect to power dissipation and package size. Typically the known prior art comprises large numbers of parallel metal-oxide-semiconductor field-effect transistors (MOSFET's) located in hybrid-circuit packages or modules which are driven with the intent to turn them all off and on simultaneously so that current is equally shared. In practice, this is very difficult to achieve because of manufacturing tolerances encountered. Switch failures most often occur in these hybrid-circuit packages during MOSFET turn-off, i.e., during circuit interruption operation. Also single MOSFET failures tend to propagate to other MOSFETs in the same hybrid package. Nevertheless, the low forward voltage drop of a configuration of parallel MOSFET's provides reduced steady state power dissipation as compared to other types of semiconductor switches and the positive temperature coefficient of the drain-source resistance insures relatively good current sharing between MOSFETs, thus making MOSFETs preferred devices for switch applications.

SUMMARY

Accordingly, it is an object of the present invention to provide an improvement in circuit breakers implemented by semiconductor switch devices.

It is a further object of the invention to provide an improvement in a DC semiconductor switch comprised of a plurality of MOSFETs connected in parallel.

It is another object of the invention to provide an improvement in a DC semiconductor switch comprised of modules of parallely connected MOSFETs.

And it is yet another object of the invention to provide a MOSFET switch configuration which overcomes the inherent limitations of the known prior art.

The foregoing and other objects are achieved by a semiconductor switch comprised of a plurality of die assembled hybrid circuit packages or modules each including a relatively large number of parallely connected semiconductor switch devices, more particularly metal oxide semiconductor field effect transistors (MOSFETS) and having an active snubber circuit connected thereto in order to remove the requirement for current sharing during circuit interruption where the MOSFETs turn-off. Each MOSFET package furthermore includes metallic arc barriers between MOSFETs to prevent an arc from propagating from one failed MOSFET to neighboring MOSFETs. Also all of the MOSFETs are turned on momentarily to extinguish arcs whenever the semiconductor switch is in an open or non-conducting condition and a current flow is detected. Clamping of the gate electrode drive bus of the MOSFETs is additionally provided to ensure fusing of gate bonding wires coupling the gate electrodes of the respective MOSFETs to the gate drive bus.

Further scope of applicability of the present invention will become apparent from the detailed description provided hereinafter. However, it should be understood that the detailed description of the preferred embodiment is made by way of illustration only, since various changes and modifications within the spirit and scope of the invention will become apparent to those skilled in the art from this detailed description.

BRIEF DESCRIPTION OF THE DRAWINGS

The present invention will become more fully understood when considered together with the accompanying drawings wherein.

DETAILED DESCRIPTION OF THE INVENTION

Figure 1:
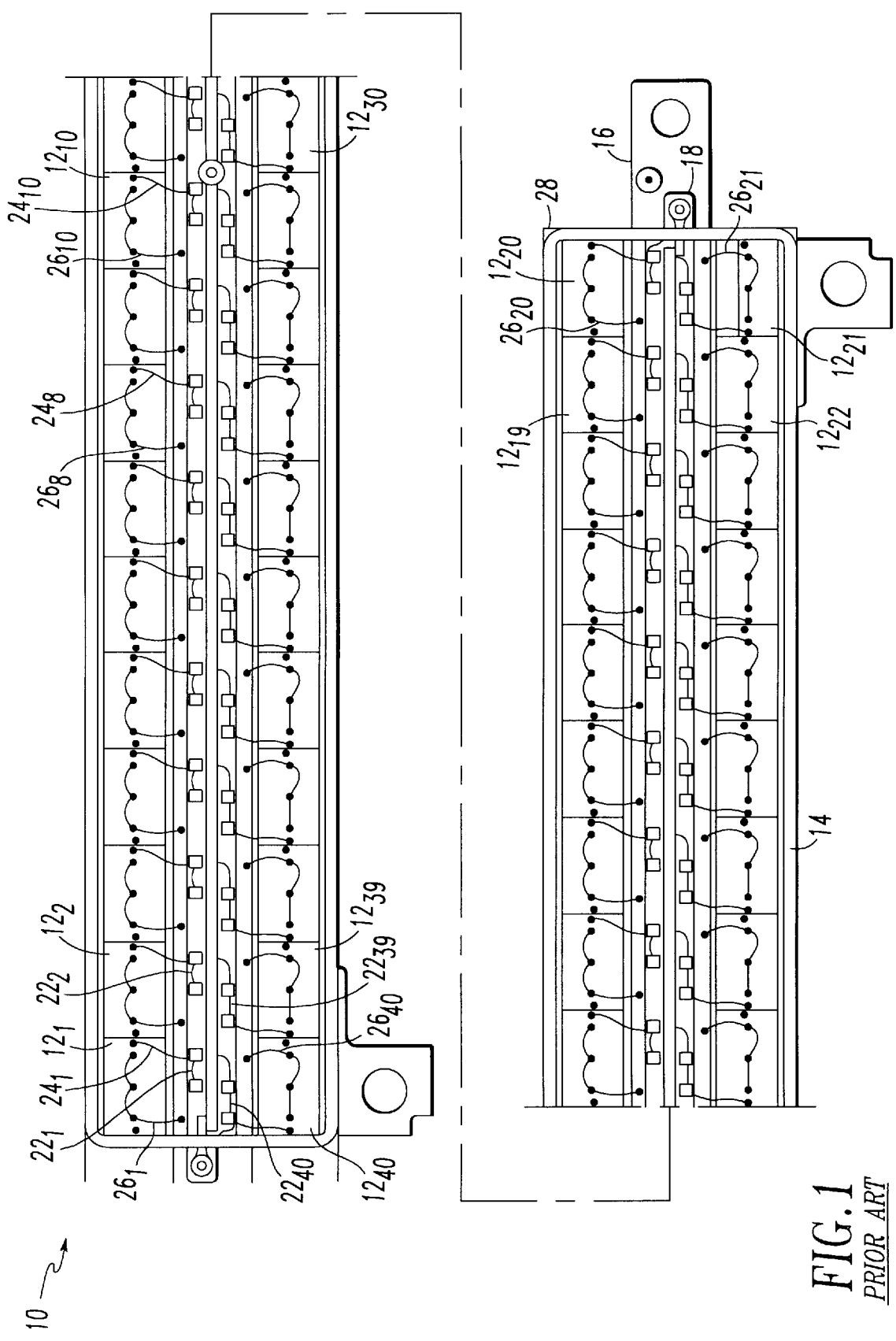
FIG. 1 is a top plan view generally illustrative of the physical layout of a MOSFET hybrid switch package or module in accordance with the known prior art.
Figure 2:
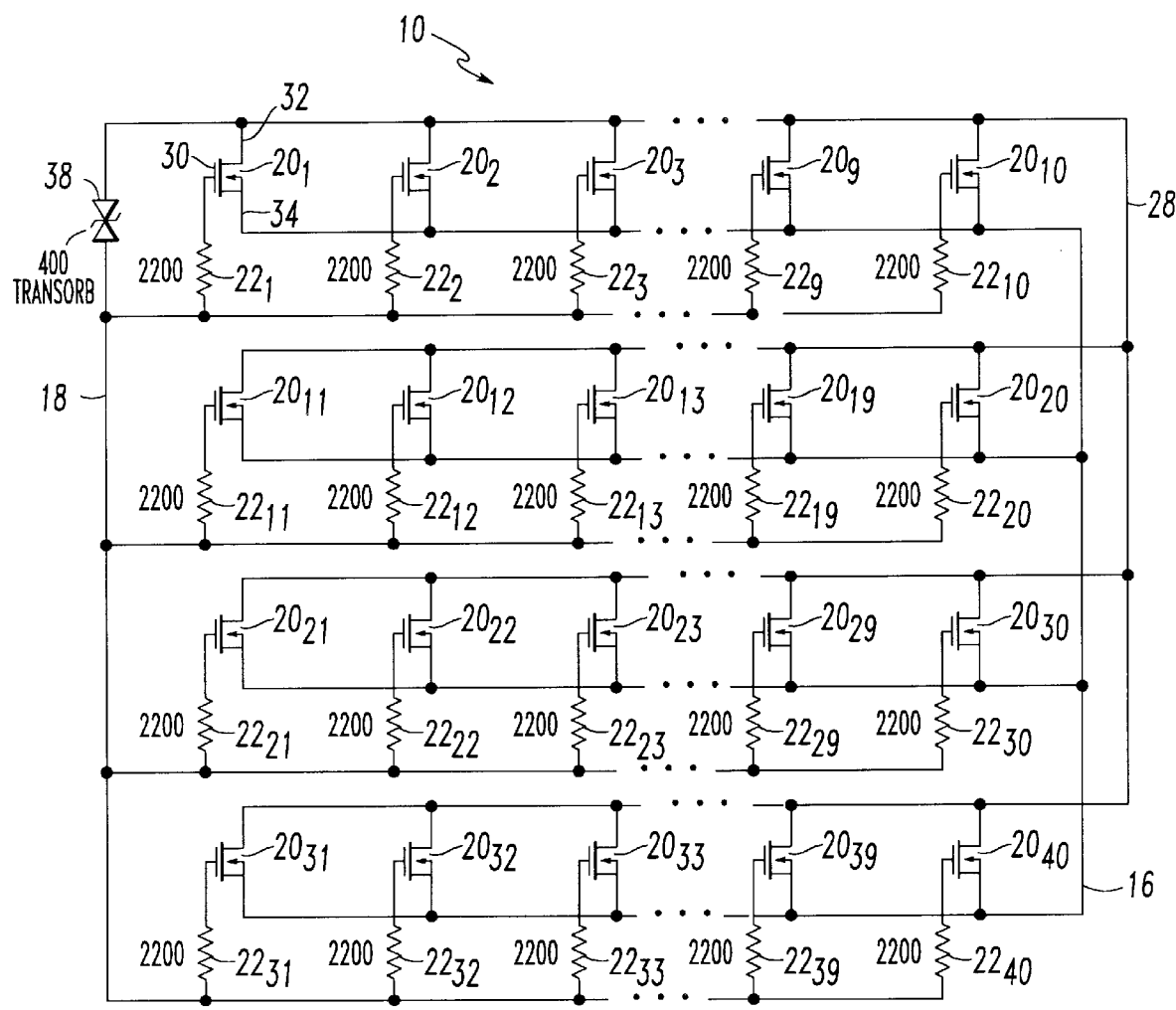
FIG. 2 is a partial electrical schematic diagram illustrative of the switch module shown in FIG. 1.
Figure 3:
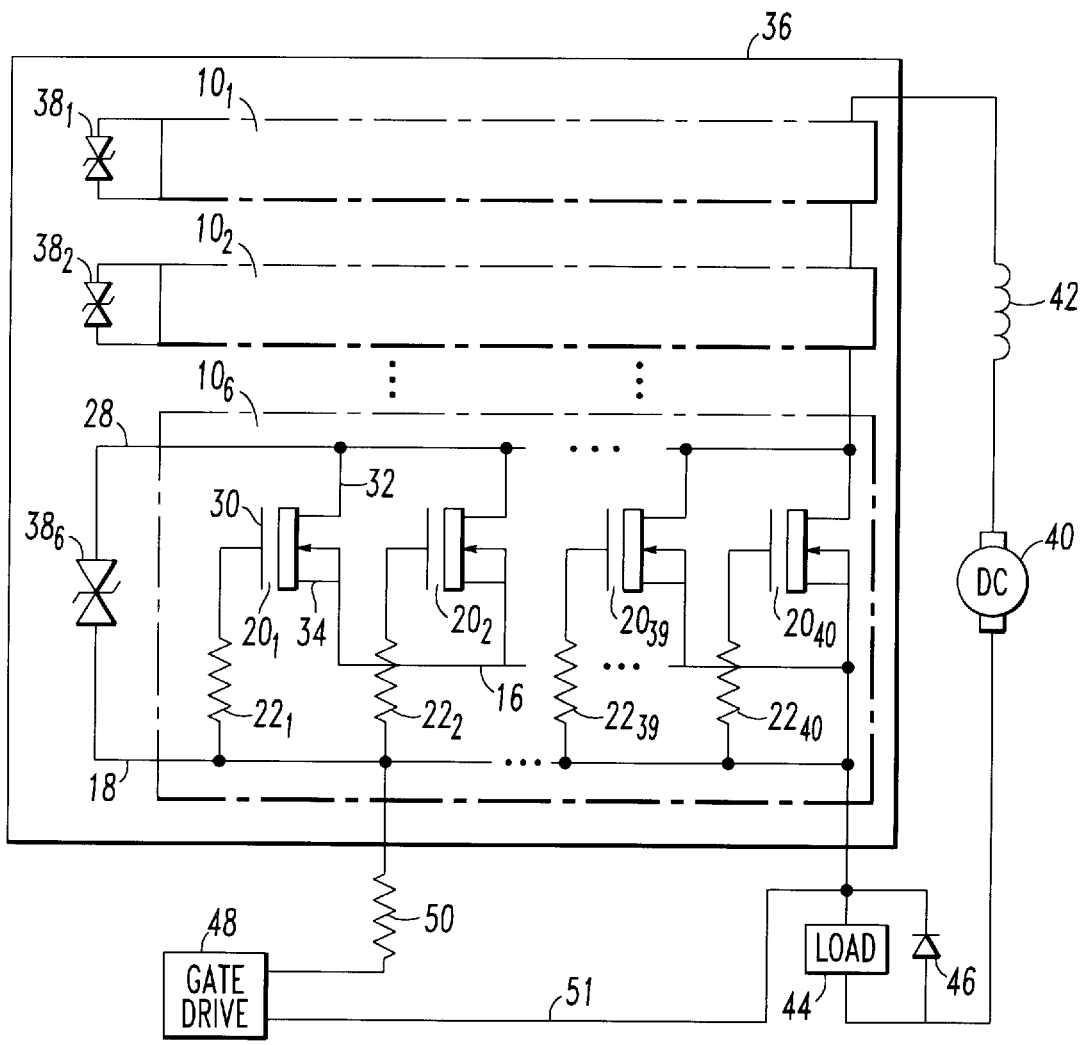
FIG. 3 is an electrical schematic diagram illustrative of a DC semiconductor switch utilizing a plurality of switch modules shown in FIGS. 1 and 2.

Prior to considering the preferred embodiment of the subject invention, further description of the known prior art as shown in FIGS. 1 through 3 will be provided.

FIG. 1, for example, discloses a hybrid circuit package or module 10 containing a plurality of semiconductor chips or dies $12_1, 12_2, \ldots 12_{39}, 12_{40}$ arranged in two parallel rows within an elongated rectangular housing 14 also including a centralized source bus 16 and an aligned relatively narrower gate bus 18 running between the dies. Each die $12_1 \ldots 12_{40}$ includes a respective semiconductor switch device, more particularly a metal oxide semiconductor field effect transistor (MOSFET). The forty MOSFETs are shown in FIG. 2 by reference numerals $20_1, 20_2, \ldots 20_{39}, 20_{40}$. Each MOSFET is associated with a respective surface mounted gate resistor $22_1, 22_2, \ldots 22_{39}, 22_{40}$. Aluminum bond wires $26_1 \ldots 26_{40}$ connect respective source electrodes, not shown to the source bus 16. Aluminum bond wires $24_1 \ldots 24_{40}$ connect gate electrodes to the gate resistors $22_1 \ldots 22_{40}$. A substrate 28 located at the bottom of the module 10 also acts as a drain bus. Each of the MOSFET's $20_1 \ldots 20_{40}$ includes a gate, drain and source electrode 30, 32 and 34 (FIG. 2).

Further as shown in FIG. 2, a transorb device 38 is coupled across all of the gate and drain electrodes 30 and 32 via the gate and drain buses 18 and 28, respectively. A transorb is a well known voltage limiter circuit device and in reality comprises a pair of zener diodes connected in back-to-back relationship.

Referring now to FIG. 3, a plurality, and in the instance, six MOSFET hybrid circuit packages $10_1 \ldots 10_6$ are arranged in parallel so as to collectively act as a semiconductor circuit interrupter or switch 36 for a DC source 40 shown having an inductive source impedance 42 and being connected to a load 44 which is also inductive, for example at 1.4 Henries and which is shunted by a suppression diode 46. A gate drive circuit is also shown by reference numeral 48 and is connected to the gate bus 18 by a coupling resistor 50.

As noted above, MOSFET devices are desirable for use as a switching device because of their low drain to source on-resistance, typically 0.2 ohms. Such a resistance value acts to substantially reduce heating in the switch 36. The substrate 28 (FIG. 1) of each hybrid circuit package $10_1 \ldots 10_6$, moreover, is bonded to a heat sink, not shown, which dissipates heat generated by the MOSFETs by natural convection. The MOSFETs drain to source on-resistance also has a positive temperature coefficient which promotes current sharing; however, a similar mechanism for sharing does not exist at turn-on or turn-off.

The choice of the value of the gate resistors $22_1 \ldots 22_{40}$ is a function of the turn-on time and the turn-off time of the MOSFETs $20_1 \ldots 20_{40}$. Because of Miller capacitance, the larger the gate resistor, the slower the turn-on and turn-off time. In the prior art circuitry as shown for example in FIG. 2, a gate resistor value of 2200 ohms was chosen in order to increase the switching time of the MOSFETs $20_1 \ldots 20_{40}$. The purpose of this was to reduce electrical noise that might effect more sensitive circuit elements associated with the subject circuitry such as logic gates. While a lower value gate resistor would offer the advantage of having the MOSFETs $20_1 \ldots 20_{40}$ spend less time during switching in a linear mode, the problem of reaching high current and high voltage simultaneously can be a possible violation of a safe-operating area for the semiconductor device which is based on current and voltage magnitude and time.

When a plurality of switch modules $10_1 \ldots 10_6$, are connected in parallel, the current sharing between the modules can be very poor when the switch is fed from an inductive voltage source such as shown in FIG. 3. Accordingly, each of the hybrid circuit packages $10_1, \ldots 10_6$ include a transorb device $38_1 \ldots 38_6$ connected between the respective drain bus 28 and the gate source bus 18. With the configuration as shown in FIG. 3 when the drains and sources 32 and 34 of the MOSFETs $20_1, \ldots 20_{40}$ of the six hybrid modules $10_1, 10_2, \ldots 10_6$ are all tied together, the drain-to-source voltage of all six modules is substantially the same. The transorb devices $38_1 \ldots 38_6$ used with each module $10_1 \ldots 10_6$, however, have a tolerance of ±5%. Thus, when the lowest voltage transorb, for example transorb $38_1$, begins to conduct, the MOSFETs $20_1 \ldots 20_{40}$ associated with module $10_1$ conduct more heavily, preventing the other transorbs $38_2 \ldots 38_6$ from ever reaching their conduction voltages. The first transorb, for example, transorb $38_1$, to conduct forces its that hybrid module $10_1$ to carry substantially all of the switching current.

Switch module failure has been found to typically occur during circuit interruption, i.e., where the MOSFETs $20_1 \ldots 20_{40}$ turn off. The set of characteristic waveforms shown in FIG. 4 is illustrative of the performance of a DC semiconductor switch 36 such as shown in FIG. 3 when all of the transorbs $38_1, 38_2, \ldots 38_6$ are perfectly matched, e.g., 400 volts, where a load current of 200 amps is being carried and all of the MOSFETs $20_1 \ldots 20_{40}$ of each hybrid circuit $10_1 \ldots 10_6$ are also matched.

Figure 4:
FIG. 4 is a set of waveforms illustrative of ideal operation of a hybrid switch module shown in FIGS. 1 and 2 wherein precisely identical components are used and exhibiting equal current sharing.
Figure 5:
FIG. 5 is a set of waveforms illustrative of undesirable operation of the module shown in FIGS. 1 and 2 wherein non-identical components are used and exhibiting unequal current sharing.

In FIG. 4, reference numerals 52 and 54 denote voltage waveforms across two of the six transorbs $38_1, 38_2, \ldots 38_6$ while reference numerals 56 and 58 depict current waveforms being carried by two of the MOSFETs $20_1 \ldots 20_{40}$ and where reference numeral 60 denotes load current. It can be seen that the MOSFET waveforms 56 and 58 are each carrying 1.0 amp steady state until the time 0.50 msec where turn-off occurs, after which current decays in an orderly manner while still equally sharing current of the total load current 60. At turn-off it can be seen that the voltage across the two transorbs 38, as evidenced by waveforms 52 and 54, rise substantially identically to 400 volts. Such is an ideal condition.

Assume now a condition where one of the six transorbs $38_1 \ldots 38_6$ conducts at 395 volts and the other transorbs conduct at 400 volts and where one of the 40 MOSFETs $20_1 \ldots 20_{40}$ in a module, for example module $10_1$, has a threshold of 2.75 volts which is 0.55 volts less than the other MOSFETs. This is a typical threshold voltage variation met in actual practice. It can be seen by reference to waveform 62 that the lower threshold MOSFET conducts about 11 amp at turn-off which reduces its margin for meeting safe operating area restrictions. This unequal sharing of current at turn-off as further shown by current waveform 64 for one of the other MOSFETs can and often leads to failure of the whole switch 40.

Figure 6:
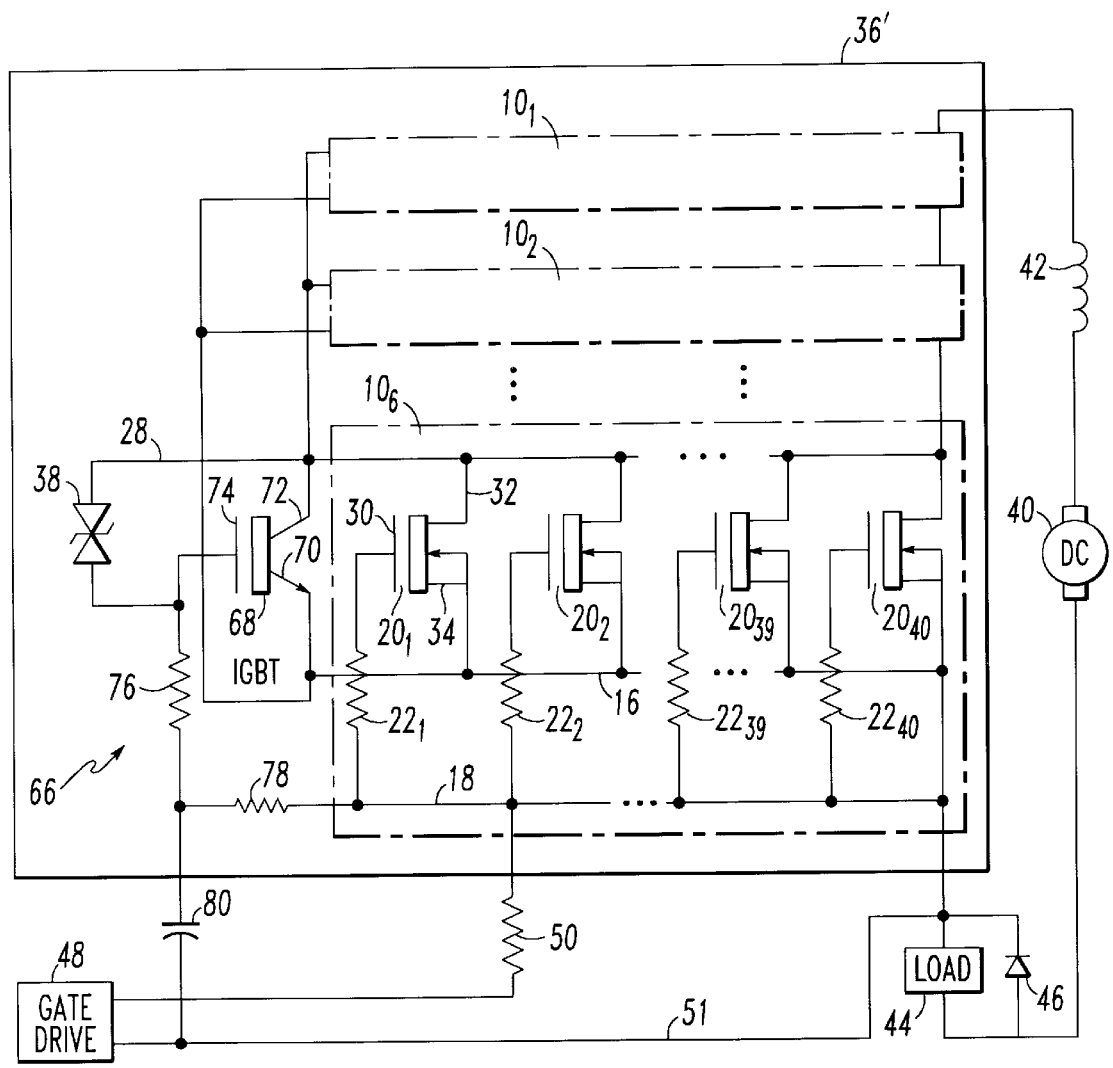
FIG. 6 is an electronic schematic diagram illustrative of a MOSFET hybrid switch module including a snubber circuit in accordance with one aspect of the invention.

In view of the foregoing the preferred embodiment of the subject invention will now be described. FIG. 6 for example, discloses a MOSFET switch configuration 36' similar to that shown in FIG. 3; however, means are now employed to divert current from the MOSFETs $20_1 \ldots 20_{40}$ during switch turn-off so that the currents do not have to be shared equally by all of the MOSFETs in the hybrid circuit packages $10_1 \ldots 10_6$ throughout a turn-off transient. The means employed comprises a snubber circuit 66 which picks up the current from the MOSFETs $20_1 \ldots 20_{40}$ at a low voltage and dissipates the energy stored in the generator source inductive impedance 43 without heating the MOSFETs.

As shown in FIG. 6, an insulated gate bipolar junction transistor (IGBT) 68 has its emitter and collector electrodes 70 and 72 coupled in parallel with the source and drain 34 and 32 electrodes of the MOSFETs $20_1 \ldots 20_{40}$ by being directly connected to the source and drain buses 16 and 26. A single transorb 38 for all six of the modules $10_1, 10_2, \ldots 10_6$ is connected between the gate electrode 74 and the collector electrode 72 of the IGBT 68. The gate drive circuit 48 in addition to being connected to the gate resistors $22_1 \ldots 22_{40}$ of the MOSFETs also is connected to the gate electrode 74 of the IGBT 68 via a gate resistor 76 and a coupling resistor 78. A capacitor 80 is also shown connected between the common connection between the resistors 76 and 78 to the signal return lead 51 of the gate drive circuit 48.

In operation the IGBT 68 carries no current while the switch 36' is closed, i.e. in a conductive state, and therefore its heat sink requirements are minimal. At turn-off, however, as the voltage rises above, for example, 2 volts, the IGBT 68 of the snubber circuit 66 conducts and carries all the load current until the energy stored in the inductive source impedance 42 is dissipated. The transient is extremely rapid, in the order of 1 to 2 milliseconds so that again the heating in the IGBT 68 is relatively small. Since no current is now carried by the MOSFETs $20_1 \ldots 20_{40}$ of the six modules $10_1 \ldots 10_6$, the failures previously experienced during switch turn-off will be substantially eliminated.

Figure 7:
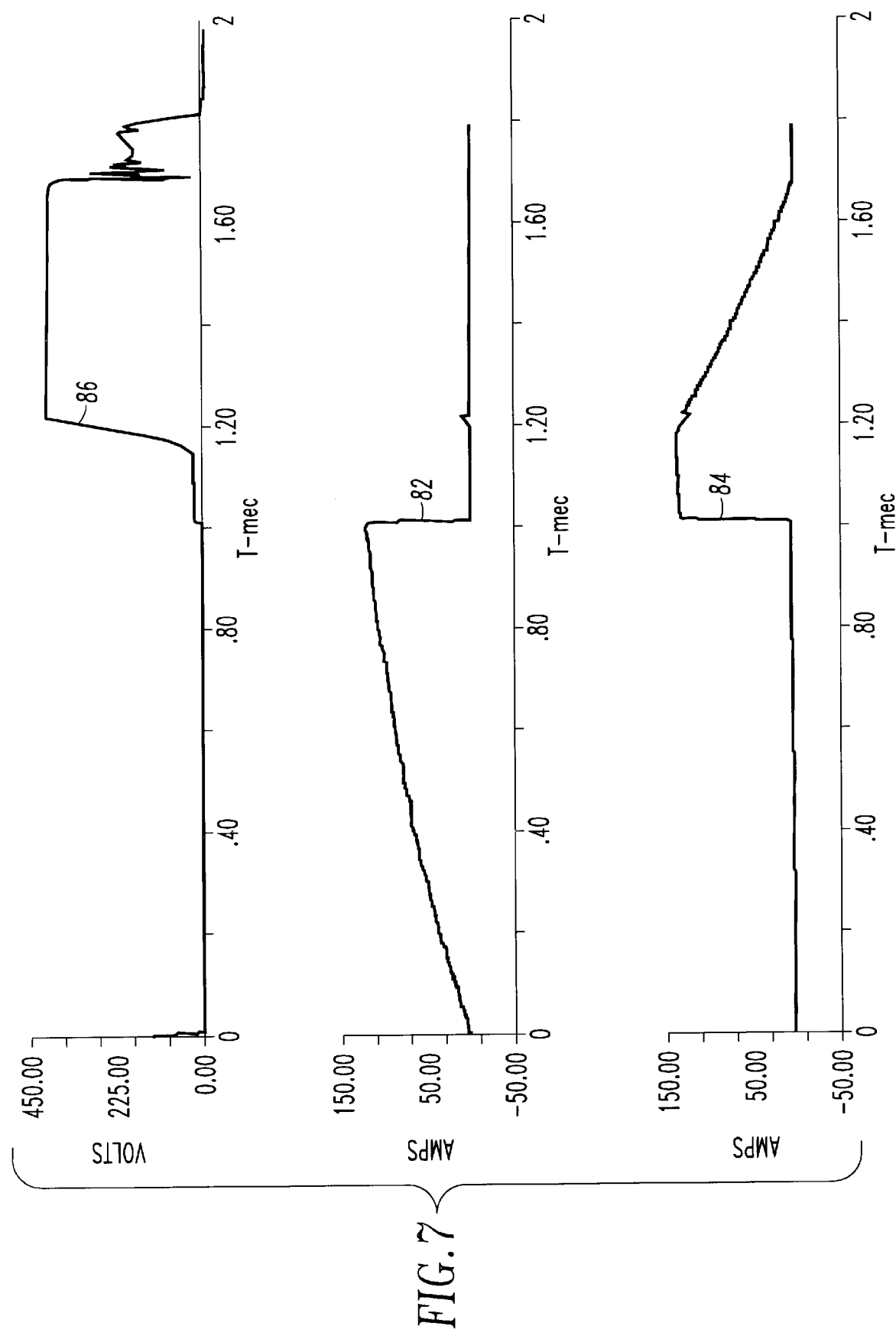
FIG. 7 is a set of waveforms illustrative of the operation of the snubber circuit configuration shown in FIG. 6.

The waveforms shown in FIG. 7 depict the operation of the snubber circuit 66 where for example at T=1.0 milliseconds the MOSFETs $20_1 \ldots 20_{40}$ are turned off and the IGBT 68 is turned on. It can be seen that as MOSFET current falls as shown by waveform 82, it is picked up by the IGBT 68 as shown by waveform 84. Waveform 86 depicts the rise in drain voltage on the drain bus during this interval.

In an application where the size of the inductive source impedance 42 of the DC source 40 is such that a single IGBT 68 is unable to handle all of the current by itself, two or more IGBT's could be operated in parallel to perform the required snubber function. Also, in some instances it may be desirable to insert some dissipation element, also not shown, in series with the IGBT collector electrode 72.

Figure 8:
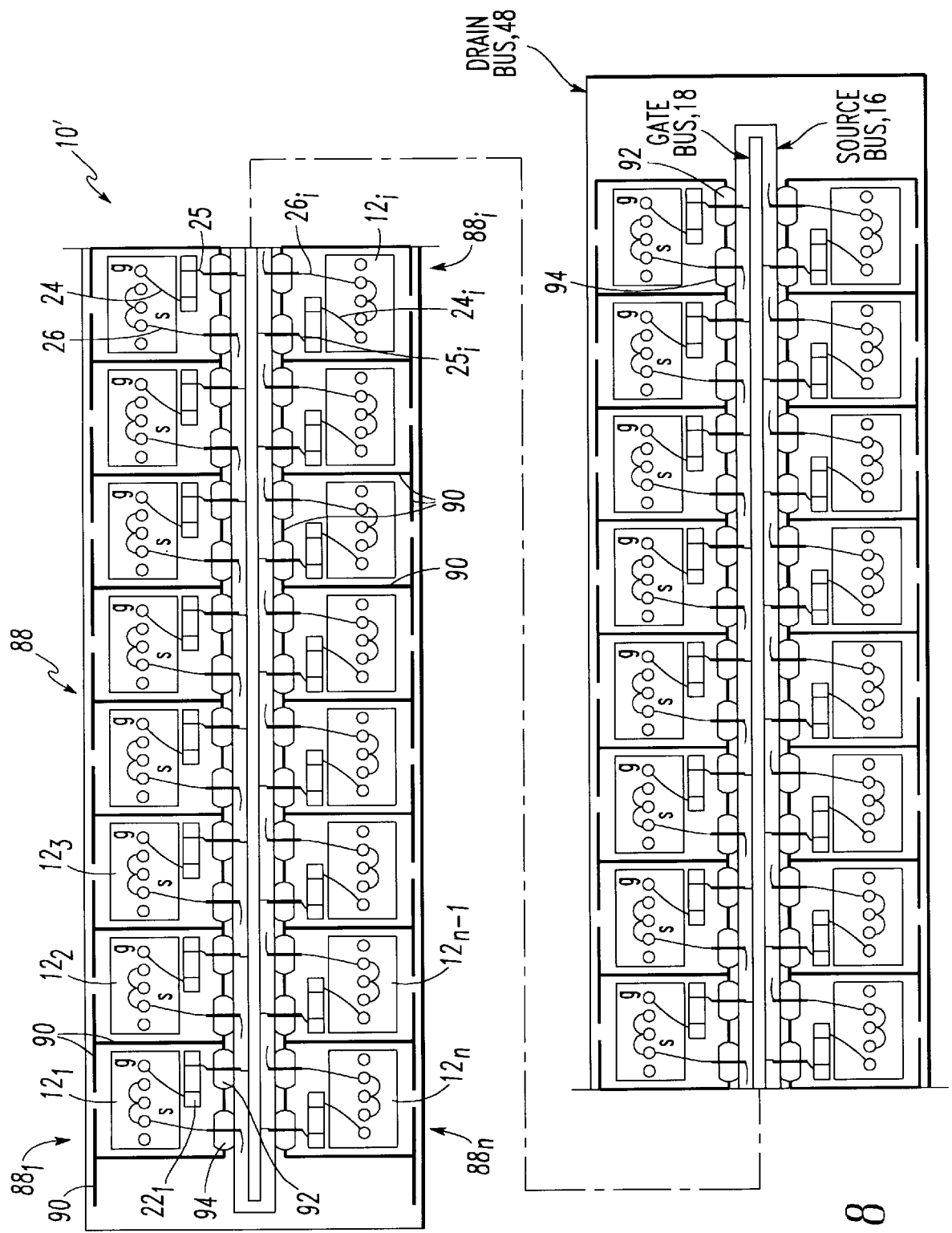
FIG. 8 is a top plan view generally illustrative of the physical layout of a MOSFET switch module in accordance with the subject invention.
Figure 9:
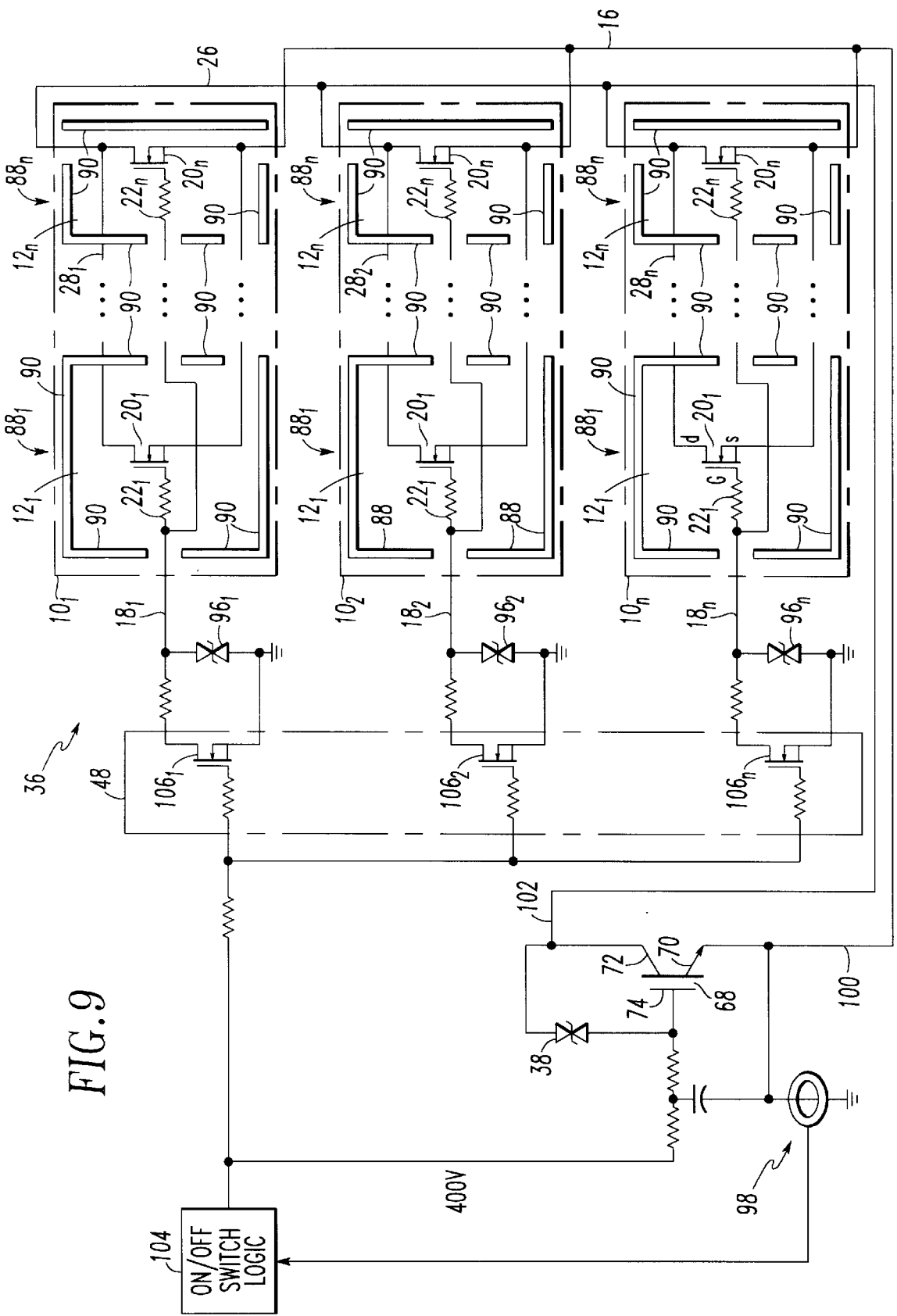
FIG. 9 is an electrical schematic diagram illustrative of the preferred embodiment of the subject invention.

FIGS. 8 and 9 disclose three additional features which make up the preferred embodiment of the invention in addition to the active snubber concept as shown in FIG. 6. It was discovered that in a relatively dense package of MOSFETs $20_1 \ldots 20_{40}$, shown in FIG. 1, a catastrophic failure of any particular MOSFET for example MOSFET $20_i$, is commonly associated with a propagation of the failure to other nearby MOSFETs. It was found that the nearby MOSFETs were being rendered conductive by direct turn-on of their gate due to the spreading of arc products associated with fused source bonding wire(s) 26 and which included the release of material or vapor which reach neighboring gate bonding paths in close proximity to the fused source bonding wire. In order to overcome this direct activation of adjacent MOSFETs, the present invention contemplates the use of an arc barrier structure 88 comprised of respective arc barrier $88_1 \ldots 88_n$ which are associated with and essentially encloses each MOSFET die $12_1, 12_2 \ldots 12_{n-1}, 12_n$ as shown in FIG. 8 and which is further shown schematically in FIG. 9.

As shown in FIG. 8 the arc barriers $81_1 \ldots 88_n$ are comprised of arc barrier line segments 90, which surround each of MOSFET dies $12_1 \ldots 12_n$ as well as its gate resistor $22_1 \ldots 22_n$ with source and gate wire connections to the gate bus 18 and the source bus 16 being made by way of a pair feed-throughs 92 and 94, respectively. The arc barrier line segments 90 present an obstacle to ionic current flow and hot gas flow to adjoining MOSFETs. Ideally the path of the arc would be lengthened during the fusing of a source bonding wire $26_i$ of a failing MOSFET $20_i$ to the point where the arc is extinguished. The arc barriers $88_1 \ldots 88_n$ are designed to have sufficient strength to withstand the gas pressure of an arc.

Because of the tight packaging constraints and the requirement for close proximity of the MOSFETs to one another as shown in FIG. 8, it is preferable that metallic, e.g. aluminum arc barrier elements be utilized. Furthermore, if aluminum is used, an insulating coating may be desirable to reduce the number of arc sites and prevent larger arcs from forming. Alternatively, the metal barriers can be referenced to a predetermined potential such as the anode potential so that there is no tendency for the arc to move from the die areas $12_1 \ldots 12_n$ to the wall segments barriers $88_1 \ldots 88_n$.

It should be noted that the gate resistor 22 associated with each MOSFET die 12 resides in the respective arc barrier enclosure 88 because of the known tendency of gate breakdown after source wire 26 fusing. The wire bonds 24, 25, as shown in FIG. 8, from the MOSFET gates 30 terminates on the gate resistor 22 and becomes the fuse for the gate circuit.

Furthermore, and as shown in FIG. 9, each gate bus $18_1 \ldots 18_n$ for the n number of modules has a low voltage, for example, 20 volt, transorb $96_1, 96_2 \ldots 96_n$ to clamp the respective gate bus $18_1, 18_2 \ldots 18_n$ to insure fusing of the gate bonding wires 24 and 25.

Because of the tendency for arc over, the present invention contemplates turning on all of the modules $10_1, 10_2 \ldots 10_n$ of the semiconductor switch 36' momentarily when unexpected current flow is detected as a result of an arc developing in order to extinguish the arc inasmuch as a voltage drop, typically less than one volt, across the switch is adequate in order to pinch off the arc current. As shown, this is provided by a Hall current sensor device 98 coupled to the gate buses $18_1 \ldots 18_n$ via a circuit connection 100 which is also coupled to the emitter electrode 70 of the IGBT snubber 68 whose collector electrode 72 is connected to the drain bus $26_1, 26_2 \ldots 26_n$ by circuit lead 102. The Hall current sensor 90 is connected to an on/off switch logic 104 whose output is resistively coupled to the gate electrode 74 of the IGBT snubber transistor 68 and the gate electrodes of the gate driving MOSFETs $106_1, 106_2 \ldots 106_n$ for the hybrid circuit packages $10_1, 10_2 \ldots 10_n$.

Thus what has been shown and described is an improved DC semiconductor circuit breaker type switch which includes four innovative features, namely: (1) providing an IGBT active snubber to remove conduction from the MOSFETs during turn-off, particularly to remove the requirement for current sharing during turn-off; (2) providing metallic arc barriers between MOSFETs to prevent an arc generated upon MOSFET failure from propagating to neighboring MOSFETs; (3) providing a momentary turn-on of the semiconductor switch to extinguish arcs whenever the switch is supposed to be off and current flow is detected; and (4) clamping the gate drive bus to insure fusing of the gate bonding wires.

Having thus described what is presently considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

We claim:

1. A semiconductor power type switch coupled between a current source having an inductive type source impedance and a load, comprising:

at least one switch circuit including a plurality of semiconductor devices connected in parallel between the current source and the load and being located on a common support structure;

a drive circuit for commonly controlling the conductive and non conductive states of said plurality of semiconductor devices of said switch circuit so as to share load current substantially equally when rendered conductive and thus close the switch; and an active snubber circuit and a voltage regulator type of device connected in parallel with said plurality of semiconductor devices of said switch circuit for carrying substantially all of the load current when said semiconductor devices are rendered non-conductive and thus open the switch in order to protect said semiconductor devices from a potentially harmful transient current surge due the inductance type source impedance.

2. A semiconductor switch according to claim 1 wherein said at least one switch circuit comprises a plurality of said switch circuits connected in parallel between the current source and the load.

3. A semiconductor switch according to claim 1 wherein said plurality of semiconductor devices of said switch circuit comprises relatively low power dissipation semiconductor devices.

4. A semiconductor switch according to claim 3 wherein said snubber circuit includes at least one other semiconductor device.

5. A semiconductor switch according to claim 4 wherein said semiconductor devices of said switch circuit and said at least one other semiconductor device of said snubber circuit are respectively comprised of first and second type of transistors.

6. A semiconductor switch according to claim 5 wherein said first type of transistor comprises a metal oxide field effect type transistor (MOSFET) and said second type of transistor comprises an insulated gate bipolar junction type transistor (IGBT).

7. A semiconductor switch according to claim 6 and wherein said voltage regulator type of device comprises a Zener diode type of device.

8. a semiconductor switch according to claim 7 wherein said Zener diode type of device comprises a transorb device.

9. A semiconductor switch according to claim 8 wherein each of said MOSFETs respectively include a source, drain and gate electrode, and said IGBT includes an emitter, collector and base electrode, wherein all of said source and emitter electrodes are connected to a first circuit bus coupled between the current source and the load, all of said drain and collector electrodes are connected to a second circuit bus coupled between the current source and the load, and said base and all of said gate electrodes are connected via respective base and gate resistors to a third circuit bus coupled to said drive circuit, and wherein said transorb is connected between the base and collector electrodes of said IGBT.

10. A semiconductor switch according to claim 9 and additionally including arc barrier means on said common support structure for physically isolating said MOSFETs and their respective gate resistors from each other so that harmful products resulting from a failure of any one of said MOSFETs and capable of causing failures of any other of said MOSFETs cannot spread thereto.

11. A semiconductor switch according to claim 9 and additionally including means for detecting any undesired load current indicative of current flow resulting from a failure of at least one of said MOSFETSs, and means responsive to said detection of undesired load current for activating said drive circuit and causing said MOSFETs to become momentarily conductive so as extinguish any arcs generated as a result of said failure.

12. A semiconductor switch according to claim 11 wherein said means for detecting undesired load current comprises a Hall current sensor.

13. A semiconductor switch according to claim 11 wherein said means for activating said drive circuit comprises an on/off switch logic circuit.

14. A semiconductor switch according to claim 9 and additionally including gate wire bond means connecting the respective gate electrodes and the gate resistors of said MOSFETs to said third bus, and means for clamping said third bus to a predetermined voltage so as to provide a fusing function of said gate wire bond means.

15. A semiconductor switch according to claim 9 and wherein said common support structure comprises an elongated package, wherein said MOSFETs reside in respective semiconductor dies arranged in two adjacent columns within the package, wherein said second bus comprises a substrate for said dies, and wherein said first and second buses comprise elongated mutually aligned bus members located between said adjacent columns and further comprising source wire bond means for coupling said source electrode of each of said MOSFETs to said first bus and gate wire bond means for coupling said gate electrode and the respective gate resistor in series to said third bus.

16. A semiconductor switch according to claim 15 and additionally including an arc barrier structure separating said semiconductor dies from each other as well as said first and second buses for protecting neighboring MOSFETs upon of failure of any of said MOSFETs.

17. A semiconductor switch according to claim 16 and additionally including source bond wire feedthrough means in said arc barrier structure for connecting said source electrodes to said first bus and gate bond wire feedthrough means in said arc barrier for connecting said gate resistors to said third bus.

18. A semiconductor switch according to claim 17 wherein said arc barrier structure comprises a plurality of linear barrier segments.

19. A semiconductor switch according to claim 14 wherein said means for clamping comprises a Zener diode type of device.

20. A semiconductor switch according to claim 19 wherein said Zener diode type of device comprises a transorb device.

* * * * *